United States Patent [19]

Kucukcakar et al.

[11] Patent Number: 5,533,179
[45] Date of Patent: Jul. 2, 1996

[54] APPARATUS AND METHOD OF MODIFYING HARDWARE DESCRIPTION LANGUAGE STATEMENTS

[75] Inventors: Kayhan Kucukcakar, Scottsdale; Rajesh Gupta, Chandler; Thomas Tkacik, Phoenix, all of Ariz.

[73] Assignee: Motorola, Inc., Schaumburg, Ill.

[21] Appl. No.: 347,665

[22] Filed: Dec. 1, 1994

[51] Int. Cl.⁶ ................................................ G06F 15/00
[52] U.S. Cl. ................................................ 395/133
[58] Field of Search ................................ 395/155, 161, 395/162, 163, 133, 140; 345/115, 116, 117

[56] References Cited

U.S. PATENT DOCUMENTS 5,297,248  3/1994  Clark ........................... 395/155
5,297,250  3/1994  Leroy et al. .................. 395/155

Primary Examiner—Phu K. Nguyen
Attorney, Agent, or Firm—Robert D. Atkins

[57] ABSTRACT

An Hardware Description Language (HDL) description file (12) is updated without requiring complete re-assignment of all tokens associated with the HDL statements. The design information is maintained as attributes assigned to the tokens (14). The tokens map onto a block diagram (16). As part of an update to the HDL text file (34), the tokens are compared to see which ones if any have changed. The text lines are compared from left-to-right and right-to-left searching for changes in the text file and associated changes in token mapping (36, 38). All tokens inclusive between the left-most change and right-most change is considered to be different. New tokens are assigned and mapped into the block diagram for the HDL elements that change (40). The mapping of old tokens are removed from the block diagram (42). The mappings from token that did not change are maintained (44).

21 Claims, 2 Drawing Sheets

APPARATUS AND METHOD OF MODIFYING HARDWARE DESCRIPTION LANGUAGE STATEMENTS

The present invention relates in general to computer-aided circuit design and, more particularly, to a method of updating statements in a hardware description language text file.

Techniques of computer-aided design (CAD) are well known and practiced in digital and analog circuit design to increase productivity. A typical process involves identifying a circuit design task and specifying a high-level functional description of the overall circuit function using a hardware description language (HDL). The HDL description may either be manually implemented in a specific circuit design or fed into CAD software that automatically configures the circuit implementation. Additional CAD software takes the computer generated implementation and creates gate-level schematics, layouts, and masks that are sent to a fabrication facility to build the integrated circuit.

There is no single software program for the entire CAD process from start to finish. In practice, the complete design may involve ten or more separate software tools to handle various sub-tasks. The intermediate sub-task results must be melded and recombined, often manually to achieve the final result. Therefore, a complete CAD system still involves significant engineering time to optimize the individual steps, adjust for changing constraints, and prepare data from one software tool for use by another software tool. The CAD process is often ad hoc requiring a number of iterations to optimize intermediate design results.

In the prior art, the HDL description is generally considered frozen, i.e. not subject to change. Any change in the basic HDL description requires a redo of the entire CAD process, including the manual optimizations steps. There is no way of knowing the impact on the overall design from a single change to the high-level circuit specification. For example, adding a primitive object such as a register file can effect placement, layout, routing, arrangement of data structures, simulation, verification, and timing constraints. All of the software tools that calculate these parameters must be repeated and optimized again.

Sometimes it is necessary to change the HDL description, possibly because of an error discovered in the previous HDL revision, or possibly to add a new feature to the circuit design. When it becomes necessary to change the HDL description most if not all of the prior art elects to start the CAD process over from scratch with the new HDL description. Reworking the entire CAD process from start to finish is time consuming and inefficient, especially if the change is relatively minor.

Hence, a need exists to allow modification to the HDL description without requiring a complete rework of the entire CAD implementation.

DETAILED DESCRIPTION OF THE PREFERRED EMBODIMENT

Figure 1:
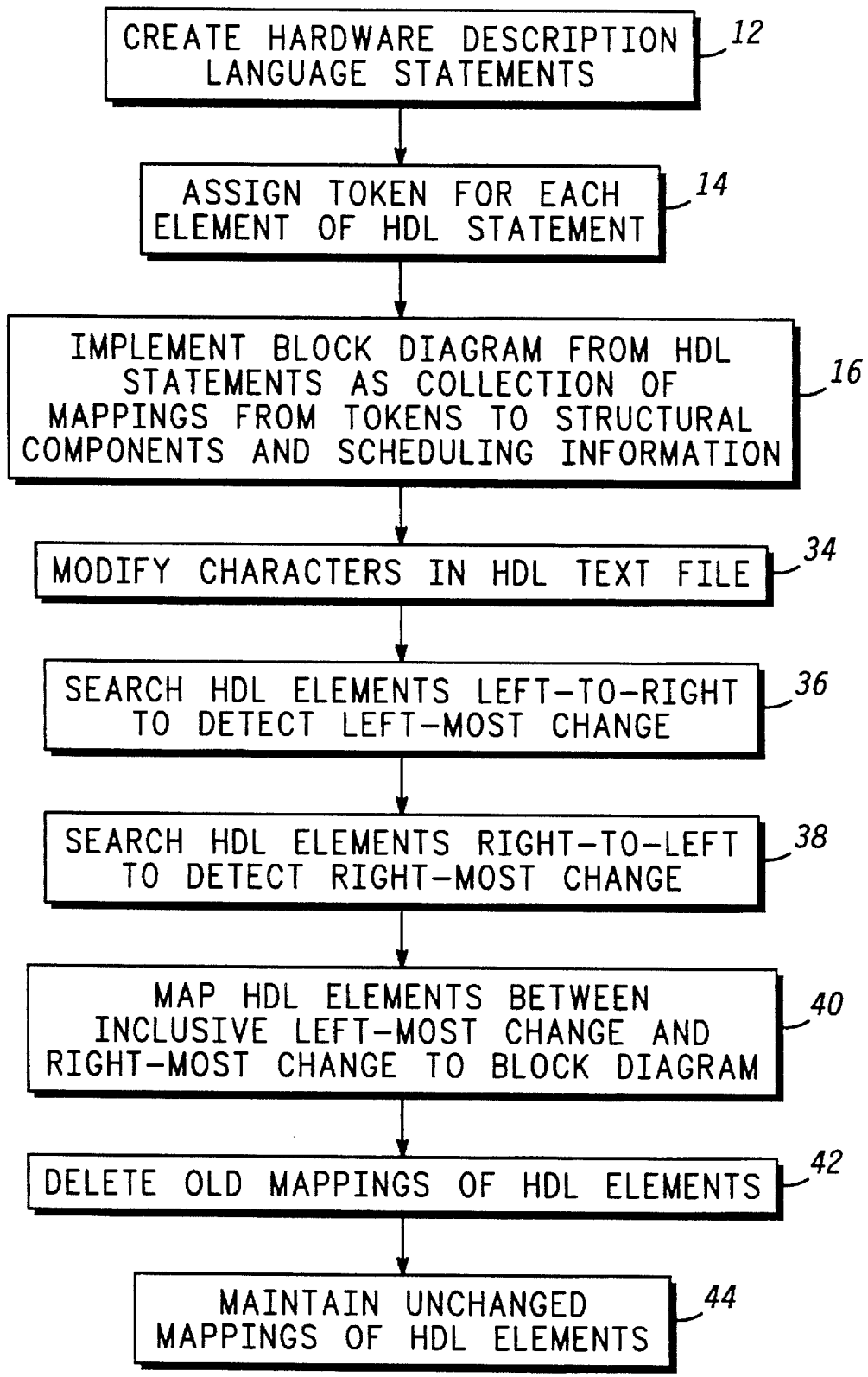
FIG. 1 illustrates a flow diagram of creating, implementing and updating an HDL description.

Referring to FIG. 1, the steps of creating, implementing and updating hardware description language (HDL) statements are shown. The process is performed in computer-aided design (CAD) software on a computer system such as a personal workstation. The computer system with its processor, memory and coding provide the means of performing the steps of FIG. 1. In step 12, the designer creates an algorithmic description of a circuit using for example an HDL that describes the desired operation of the circuit from a high level of abstraction. For example, a simple algorithmic description may comprise HDL statements as follows:

input A, B, C;

D=A+B;

E=C+D;

The above HDL statements are characters within a text file on the computer system. Each variable name, instruction and operation is an element. In step 14, tokens are assigned for each element of the HDL statements. For example, "input" is assigned a first token, A is assigned a second token, and so on. Tokens have a fixed identity and act as a "place holder" to contain algorithm- to-implementation mappings which are the relationships between a token and the block diagram that is implemented by it, the interconnect for the block diagram, and the scheduling information for the HDL statement. For example, a token representing an addition element in an HDL statement may include a mapping to an adder or arithmetic logic unit while the tokens representing the variables in the same HDL statement may include mappings to define the interconnect needed to perform the HDL statement using the given adder. Some tokens do not contain any mappings since they exist to provide a formal syntax of the HDL, e.g. "input", ",", and ";".

Figure 2:
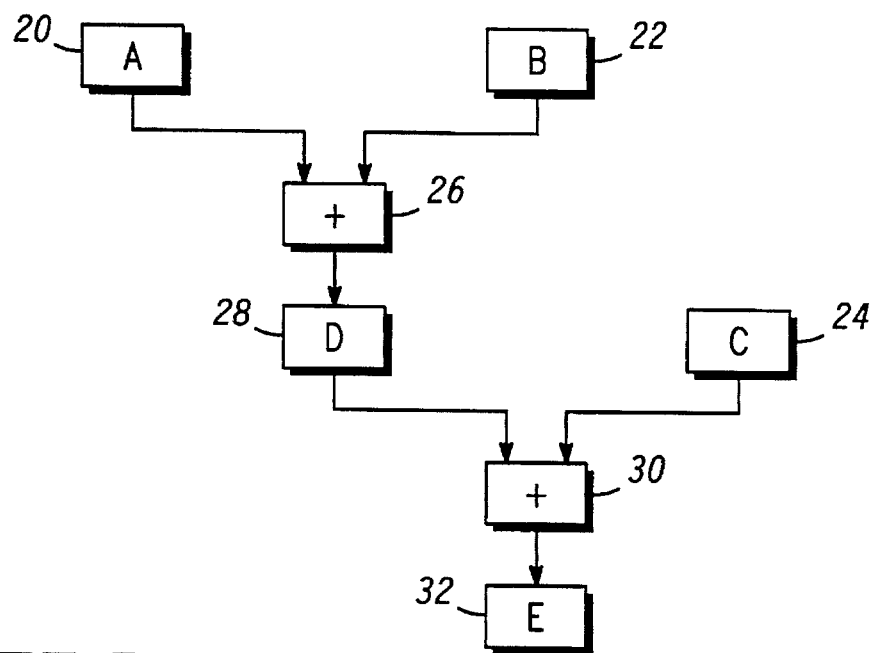
FIG. 2 illustrate an implementation of the HDL description.

The text file is read and mapped to a block diagram implementation by CAD software according to step 16 as shown in FIG. 1. In FIG. 2, the input parameters A, B, and C are stored in registers 20, 22 and 24, respectively. A first token encodes "input" for syntax but does not contain any mappings. A second token A provides a mapping to register 20. That is, register 20 is placed and the input A is physically routed to register 20 for storage in its memory. With the second token for A, the CAD software knows the source of input A, type of data, number of data lines on the interconnecting data bus, propagation time, clocking, width of register 20, setup and hold-time of register 20, etc A third token encodes "," for syntax but does not contain any mappings. A fourth token B is mapped into register 22, while a fifth token encodes the second "," for syntax but does not contain any mappings A sixth token C maps into register 24. A seventh token encodes ";" for syntax but does not contain any mappings.

The A in register 20 and the B in register 22 are summed in adder 26 and the result D is placed in register 28. Tokens A and B on the second line include mappings that define how A and B are routed from registers 20 and 22 into adder 26. The D in register 28 is summed with the C in register 24 by way of adder 30 and the result E is placed in register 32. Token D includes a mapping that define how the result from adder 26 is routed into register 28. Tokens D and C on the third line include mappings that define how D and C are routed from registers 28 and 24 into adder 30. The token for E includes a mapping that define how the result from adder 30 into register 32.

With the above HDL statements mapped into the block diagram of FIG. 2 by the information contained in the tokens, the next level of CAD software, e.g. schematic diagram and simulation, may continue processing the design. If it becomes necessary to modify one or more of the HDL statements, an editor software program is used to alter characters in the HDL text file. In the prior art, tokens are assigned at the time the CAD software maps the HDL statements into the block diagram implementation. Any altering of characters in the HDL text file changes the ordering assignment of tokens and forces a complete re-design from the new token assignments.

As part of the present invention, tokens are assigned to each element of the HDL text file when originally created in step 14. The design information is maintained as attributes associated with the tokens. Token attributes include name of token, type of token, mapping to block diagram, scheduling, layout, routing, and other configuration data. It may become necessary or desirable to make changes to the HDL description after the block diagram shown in FIG. 2 is created. As part of any character edit to the HDL statement, in addition to updating characters in the HDL text file, the tokens that are assigned to the HDL elements are compared in the background of the editor software to the previously assigned tokens to determine the degree and amount of change. For example, a change in the HDL description may involve a change in token name or token type. Only those changes to the token name or token type that reflect updates to the mappings, the block diagram, and other design data are made. By keeping the design attributes of unchanged tokens in place, the impact of any change to the HDL description on the block diagram is kept to a minimum.

Assume that the previous HDL statements change as follows.

input F, A, B, C;

D=A+F;

E=C+D;

The text file is updated by adding another input F and making D=A+F. The designer modifies the text file with the editor program by adding F to the input statement, and changing D=A+B to D=A+F. The editor software makes the appropriate changes to the text file in per step 34 in FIG. 1. The editor software also compares the token assignments. Only the text lines that are involved in the editing process are examined in the background of the text file editor for token changes. In comparing the token assignments, the editor starts with the left-most element in the first line, i.e. "input". The "input" element matches the prior HDL statement, hence, its token name, or token type did not change and are still valid. In step 36, the editor continues searching right to detect the leftmost change. The next element "F" did change, i.e. element "F" ≠ element "A" in token name and token type. The comparison between pre-edit tokens and post-edit tokens no longer matches since token "F" is new. Once the left-most change has been found, the editor moves to the right-most element ";" ";" and begins searching left to detect the rightmost change as per step 38. The element ";" did not change and remains valid. Likewise, the element "C" did not change, the element "B" did not change, and the element "A" did not change Both tokens for elements "C" "B" and "A" remain valid. Again, the element "F" did change. In step 40, the elements inclusive between the left-most change and the right-most change, i.e., element "F" are identified as needing new token assignments. The elements that did not change keep their previous token assignments.

In the second line, the editor starts with the leftmost element "D" and notes that it did not change. The token for the element "D" in the second line is still valid. The next element "A" did not change and remains valid. Likewise, the element "+" did not change. Both tokens for elements "A" and "+" in the second line remain valid. The next element "F" did change because it replaced "B". Once the left-most change has been found, the editor moves to the right-most element "F". The element "F" is also the right-most change. The elements inclusive between the left-most change and the right-most change, i.e. element "F", are identified as needing new token assignments. The elements that did not change keep their previous token assignments. It is not necessary to check the third line since no edits were made to that line.

In an alternate embodiment, the editor may have compared from the right-most element first for different characters and before moving to the left-most element. Another search pattern may begin in the middle and compare outward in both directions. Whatever the search pattern, the editor detects which tokens have changed. The HDL elements inclusively between the left-most change and the right-most change are updated in the block diagram to reflect the new mapping information.

Figure 3:
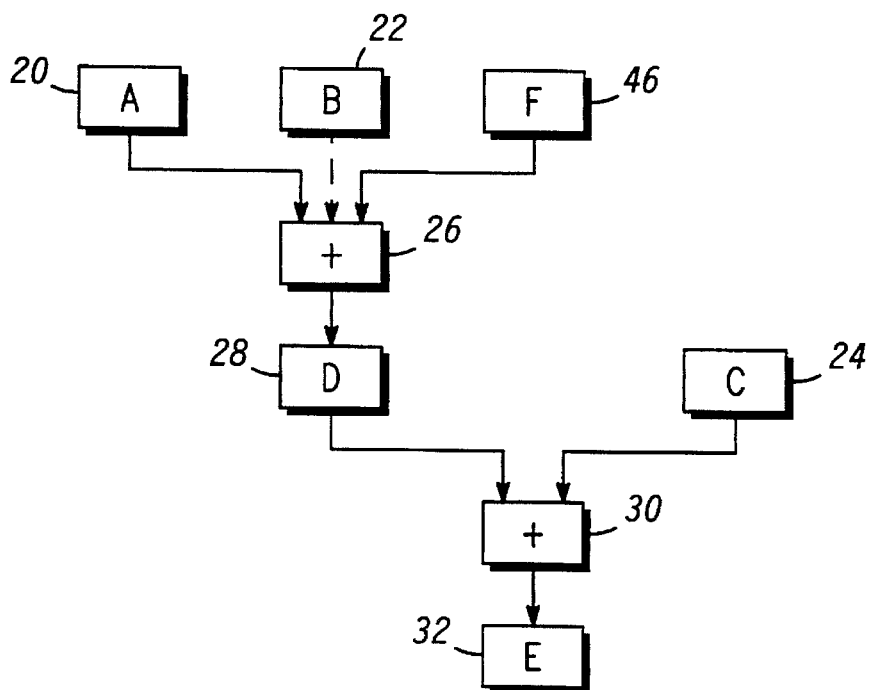
FIG. 3 illustrates a modified implementation of the HDL description.

Turning to FIG. 3, the new tokens are mapped into the prior block diagram. The input parameters F, A, B, C, and F are stored in registers 34, 20, 22, and 24, respectively. In step 42, the mappings of old tokens are removed from the block diagram. The mapping between register 22 and adder 26 is deleted as shown by the dashed interconnect line. In step 44, the mappings from token that did not change are maintained. The A in register 20 and the F in register 46 are summed in adder 26 and the result D is placed in register 28. The D in register 28 is summed with the C in register 24 by way of adder 30 and the result E is placed in register 32. By keeping track of which tokens changed, only the new tokens are assigned new tokens to map into the block diagram. For simple changes, the majority of the prior block diagram remains intact. The interconnect, scheduling, layout, routing, and other configuration of the unchanged tokens remains valid.

The above description is equally applicable to more complex editing, say where the statement D=A+B is replaced with D=A*B. In this second example, the mappings to adder 26 are removed and register 20 and 22 are mapped instead to a multiplier (not shown). The output of the multiplier maps to register 28.

Another option supports a special case of renaming elements within the HDL description. With a special flag set by the user, the editor program may compare only the token type instead of comparing the token type and token name. For example, if the character A is renamed as A1, then no changes are necessary to the block diagram since the attributes of the input data has not changed. The prior assigned token attributes to the HDL element remain intact.

By now it should be appreciated that the present invention allows character editing of an HDL description file without requiring complete re-assignment of all associated tokens. The design information is maintained as attributes assigned to the tokens. As part of an update to the HDL text file, the tokens are compared to see which one(s) if any have changed. The modified text lines are compared from left-to-right and right-to-left searching for changes in the text and associated changes in token mappings. All elements between the first detected change on a line from the left and the first detected change from the right are considered to be different. New tokens are assigned for the HDL elements that change. The new tokens are mapped into the block diagram. The mappings of old tokens are removed from the block diagram. The mappings from token that did not change are maintained.

By keeping the attributes of unchanged tokens in place, e.g. mappings to block diagram, scheduling, layout, and routing, the impact on the block diagram is minimized. Thus, the present invention provides an advantageous feature of copying a previous design and, after making necessary changes, re-map only the new tokens to achieve a new design. The designer may maintain a portfolio of standard HDL designs and, by making minor modification to the HDL, come up with new design much more rapidly the remapping the entire HDL description. A product may be optimized for power consumption in one application and, by changing a few design criteria, optimize for performance with minimal rework. The design attributes of the unchanged tokens stays in place to simply the effort in realizing the final schematic diagram, scheduling, layout, and routing.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A computer implemented method of modifying hardware description language (HDL) statements, comprising the steps of:

assigning tokens for each element of an original HDL description;

implementing said original HDL description as a block diagram from mappings of said tokens to structural components;

modifying said original HDL description to generate a modified HDL description;

detecting elements of said modified HDL description that changed and elements of said modified HDL description that stay the same;

mapping said elements that changed to said block diagram; and maintaining said elements that stayed the same.

2. The computer implemented method of claim 1 further including the step of deleting prior mappings of tokens of said modified HDL description that have been changed.

3. The computer implemented method of claim 2 wherein said detecting step includes the step of searching one end of said modified HDL description to identify tokens that match said original HDL description.

4. The computer implemented method of claim 3 wherein said detecting step includes the step of detecting a left-most token from said modified HDL description that changed from said original HDL description.

5. The computer implemented method of claim 4 wherein said detecting step includes the step of searching a second end of said modified HDL description to identify tokens that match said original HDL description.

6. The computer implemented method of claim 5 wherein said detecting step includes the step of detecting a right-most token from said modified HDL description that changed from said original HDL description.

7. The computer implemented method of claim 1 wherein said modifying step includes the steps of:

displaying said original HDL description by character;

modifying identified tokens of said original HDL description;

updating said characters of said original HDL description; and modifying said mappings of said identified tokens that differ from the original token.

8. A computer implemented method of modifying hardware description language (HDL) statements, comprising the steps of:

providing an original HDL description of a circuit functionality;

assigning tokens for each element of said original HDL description;

implementing said original HDL description as a block diagram from mappings of said tokens to structural components;

modifying said original HDL description to generate a modified HDL description;

detecting tokens of said modified HDL description that changed and tokens of said modified HDL description that stay the same;

mapping said tokens that changed to said block diagram; and maintaining said tokens that stayed the same.

9. The computer implemented method of claim 8 further including the step of deleting prior mappings of tokens of said modified HDL description that have been changed.

10. The computer implemented method of claim 9 wherein said detecting step includes the step of searching one end of said modified HDL description to identify tokens that match said original HDL description.

11. The computer implemented method of claim 10 wherein said detecting step includes the step of detecting a left-most token from said modified HDL description that changed from said original HDL description.

12. The computer implemented method of claim 11 wherein said detecting step includes the step of searching a second end of said modified HDL description to identify tokens that match said original HDL description.

13. The computer implemented method of claim 12 wherein said detecting step includes the step of detecting a right-most token from said modified HDL description that changed from said original HDL description.

14. The computer implemented method of claim 8 wherein said modifying step includes the steps of:

displaying said original HDL description by character;

modifying identified tokens of said original HDL description;

updating said characters of said original HDL description; and modifying said mappings of said identified tokens that differ from the original token.

15. An apparatus for modifying hardware description language (HDL) statements, comprising:

means for assigning tokens for each element of said original HDL description;

means for implementing said original HDL description as a block diagram from mappings of said tokens to structural components;

means for modifying said original HDL description to generate a modified HDL description;

means for detecting tokens of said modified HDL description that changed and tokens of said modified HDL description that stay the same;

means for mapping said tokens that changed to said block diagram; and means for maintaining said tokens that stayed the same.

16. The apparatus of claim 15 further including means for deleting prior mappings of tokens of said modified HDL description that have been changed.

17. The apparatus of claim 16 further including means for searching one end of said modified HDL description to identify tokens that match said original HDL description.

18. The apparatus of claim 17 further including means for detecting a left-most token from said modified HDL description that changed from said original HDL description.

19. The apparatus of claim 18 further including means for searching a second end of said modified HDL description to identify tokens that match said original HDL description.

20. The apparatus of claim 19 further including means for detecting a right-most token from said modified HDL description that changed from said original HDL description.

21. The apparatus of claim 15 further including:

means for displaying said original HDL description by character;

means for modifying identified tokens of said original HDL description;

means for updating said characters of said original HDL description; and means for modifying said mappings of said identified tokens that differ from the original token.

* * * * *